United States Patent [19]

Schneider et al.

[11] 4,295,870

[45] Oct. 20, 1981

[54] PROCESS FOR THE PRODUCTION OF GLASS FOR A GLASS WORKPIECE FOR USE IN DRAWING A GLASS LIGHT CONDUCTING FIBER OF A LOW ATTENUATION

[75] Inventors: Hartmut Schneider; Egon Lebetzki, both of Munich, Fed. Rep. of Germany

[73] Assignee: Siemens Aktiengesellschaft, Berlin & Munich, Fed. Rep. of Germany

[21] Appl. No.: 169,951

[22] Filed: Jul. 18, 1980

[30] Foreign Application Priority Data

Aug. 31, 1979 [DE] Fed. Rep. of Germany ....... 2935347

[51] Int. Cl.$^3$ ............................................. C03B 37/075
[52] U.S. Cl. ..................................... 65/3.12; 427/163
[58] Field of Search ....................... 65/3.11, 3.12, 3.13; 427/163, 181, 237

[56] References Cited

U.S. PATENT DOCUMENTS 3,806,570  4/1974  Flamenbaum et al. .......... 65/3.12 X

*Primary Examiner*—Richard V. Fisher
*Attorney, Agent, or Firm*—Hill, Van Santen, Steadman, Chiara & Simpson

[57] ABSTRACT

In a process for producing a glass blank or workpiece from which a glass fiber light conductor of a low attenuation is drawn, said workpiece being formed by providing a body on which amorphous glass powder is precipitated from a reaction gas after a chemical reaction and then transformed into a clear glass characterized by the reaction gas being passed over or through a powder composed of amorphous glass of the same type which is being precipitated from the reaction gas onto the body to filter impurities therefrom. Preferably, the amorphous powders of the filter are contained in a precipitator and are produced by also reacting the gas and collecting the powder in the precipitator.

7 Claims, 2 Drawing Figures

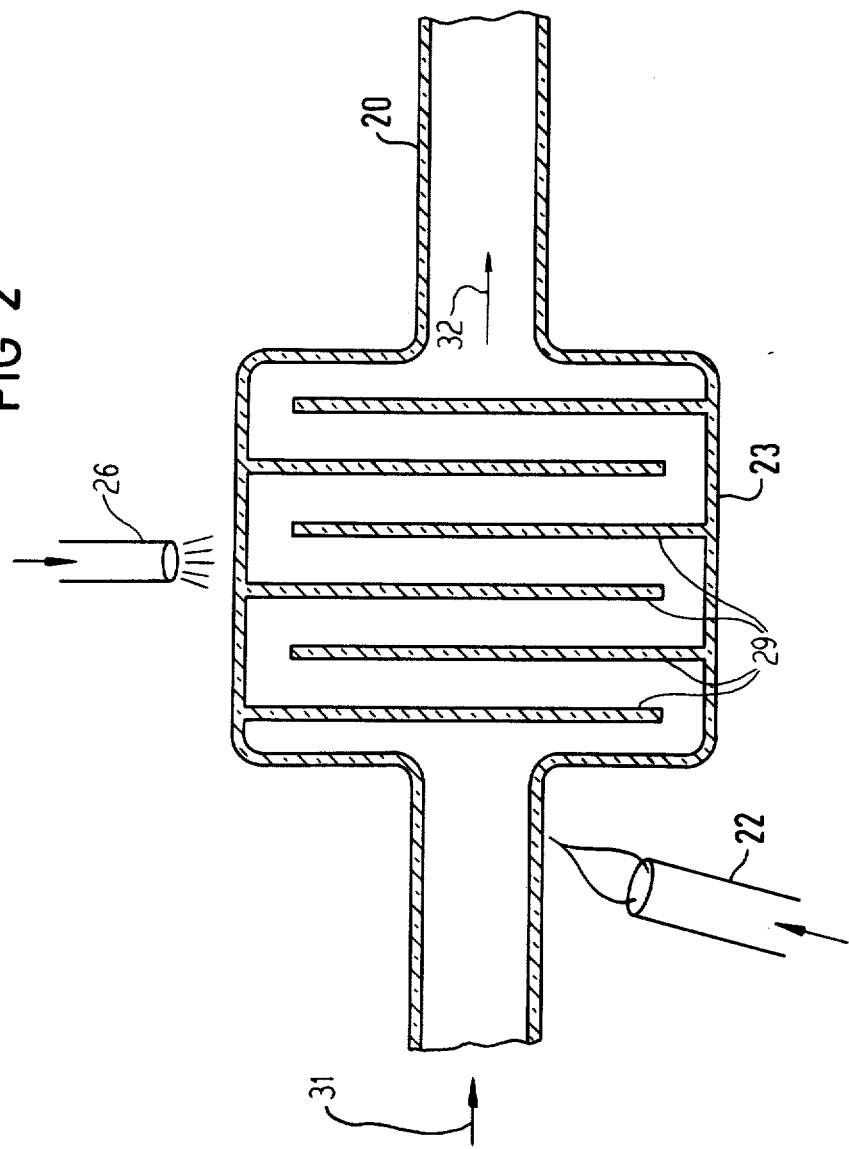

PROCESS FOR THE PRODUCTION OF GLASS FOR A GLASS WORKPIECE FOR USE IN DRAWING A GLASS LIGHT CONDUCTING FIBER OF A LOW ATTENUATION

BACKGROUND OF THE INVENTION

The present invention is directed to a process for the production of a glass workpiece from which a glass fiber light waveguide of a low attenuation is drawn which process includes depositing amorphous glass powders from a reactive gas, onto a surface of a body and subsequently transforming the amorphous glass powders into a glass film.

Glass fiber light waveguide conductors composed of extremely pure glass are used for optical communication transmission. A known process for the production of the glass fiber of this type is based upon providing a work piece or blank from which the fiber is then drawn. The workpiece or blank can be produced by a process in which an amorphous glass powder is precipitated on a surface of a body and then subsequently melted to form a layer or film of glass. Such a process is known as a chemical vapor deposition process, and commonly known under the term "CVD Process". In this process, the glass body normally consists of a quartz glass tube whose interior is contacted with the reaction gas. Normally a glass film having a low index of refraction is first applied on the interior of the quartz glass tube whereupon a glass film having a higher index of refraction is subsequently applied. The reaction gases used for this purpose are, for example, silicon tetrachloride and one or more other suitable doping gases such as boron trichloride, germanium tetrachloride, etc., and hydrogen. These reaction gases are caused to react on the surface of the tube to form the amorphous oxide which is partially or entirely precipitated on the wall surfaces of the tube where it is melted to form the glass film. The blank produced in this way is subsequently collapsed so as to form a rod and the final workpiece or blank is then drawn into the form of a glass fiber. Light conducting fibers having an attenuation value from approximately 2 to 3 dB/km for a wavelength of 850 nm can be produced from such a blank.

In long distance traffic applications, in which the device itself and the supply of intermediate amplifiers require a heavy financial outlay, for example, in a deep sea cable, it is desirable to produce fibers having a lower attenuation value. It is also desirable that these fibers be produced in a cost favorable process that has the lowest expenses.

A source of light loss along the fiber will consist fundamentally of impurities in the glass. These impurities may be hydroxyl groups for example, $\equiv$Si-OH, and metal oxides for example $Fe_2O_3$. For this reason, the reaction gases utilize a low humidity oxygen where the $H_2O \leq 5$ vppm and chlorides of a commercially available semiconductor quality in which the $SiHCl_3$ in the $SiCl_4$ type is $\leq 0.2\%$. When an apparatus which is subsequently impervious to gas is used and a dust filter is arranged prior to the glass body acting as the reaction tube, the above mentioned attenuation values can be achieved. Under conditions of extreme purity, attenuation values of $\leq 1$ dB/km for a wavelength of 850 nm and $\leq 0.5$ dB/km for a wavelength of 1200 nm have in fact been achieved. (See M. Horiguchi et al; Electronics Letters, June 10, 1976, Vol. 12, No. 12; pages 310–312). In this case, in particular, it was ensured that no free or chemically bonded hydrogen entered the reaction tube as a potential source for the OH groups. For this purpose, the following measures were adopted. For example, cleansing of the chlorides of hydrogen compounds for example, silane and hydrogen chloride, by distillation; elimination of water and hydrocarbons from the oxygen; drying of the chloride vessels; flushing with insert gases during the filling of the chloride vessels; and etc. However, all these measures require a considerable outlay in time and are expensive and subject to disturbances. Furthermore, in practice, it is virtually unavoidable to keep the reaction mixture free of pollution. For example, leaks or corrosion phenomena in the pipeline system or due to flushing with water or particles of dust during the rotation of the glass tube at the time of the glass deposition will cause a pollution of the mixture.

SUMMARY OF THE INVENTION

The present invention is directed to providing a process for producing a workpiece or blank, which is subsequently drawn into a light conducting fiber having a low attenuation and the process enables producing the blank in a simple and problem free manner.

These objects are achieved by an improvement in a process for the production of a workpiece from which a glass fiber light waveguide of a low attenuation is drawn, said process comprising providing a body, providing a reaction gas, producing an amorphous glass powder from the reaction gas by a chemical reaction, precipitating the amorphous glass powder on the body and subsequently transforming the precipitated powder into a clear glass layer. The improvement comprises the step of providing the reaction gas including providing a filter composed of a powder of amorphous glass of an identical nature to the amorphous glass being precipitated on the body from the chemical reaction of the reaction gas and contacting the reaction gas with the powder of the filter prior to the step of producing the amorphous glass powder by the chemical reaction.

The invention exploits the good absorption properties of a powder which is composed of the amorphous glass which is of an identical nature to that which is to be deposited from the reaction gas onto the body. Thus, the powder composed of the specific amorphous glass serves as an excellent filter.

A particular advantageous and expedient embodiment of the process in accordance with the present invention occurs when the step of providing a filter comprises providing a powder precipitator containing the amorphous glass powder of the filter and supplying a reaction gas to the precipitator to produce the amorphous glass powder therein. In this process, the powder composed of the amorphous glass, which acts as the filter, is produced from the supplied reaction gas and is collected in the powder precipitator. The quantity of the powder which acts as a filter can be very easily controlled by selective initiation and termination of the chemical reaction in the precipitator.

In the event that the body consists of a hollow body such as a hollow glass tubular body whose interior surface is to be contacted with reaction gas, it is expedient if an outlet of the powder precipitator is connected to the opening of the body and preferably the outlet of the precipitator is fused to the end of the body. This is particularly expedient if the body is a glass tubular member and the precipitator is also formed out of a glass body.

Preferably, the reaction gas contains at least one oxidizable silicon compound and an oxidizing gas. If doped silicon dioxide layers are to be produced, it is expedient for the reaction gas to also contain an oxidizable doping compound.

BRIEF DESCRIPTION OF THE DRAWINGS

FIG. 2 is a longitudinal cross-section of a powder precipitator having a labyrinth path in accordance with the present invention.

DESCRIPTION OF THE PREFERRED EMBODIMENTS

Figure 1:
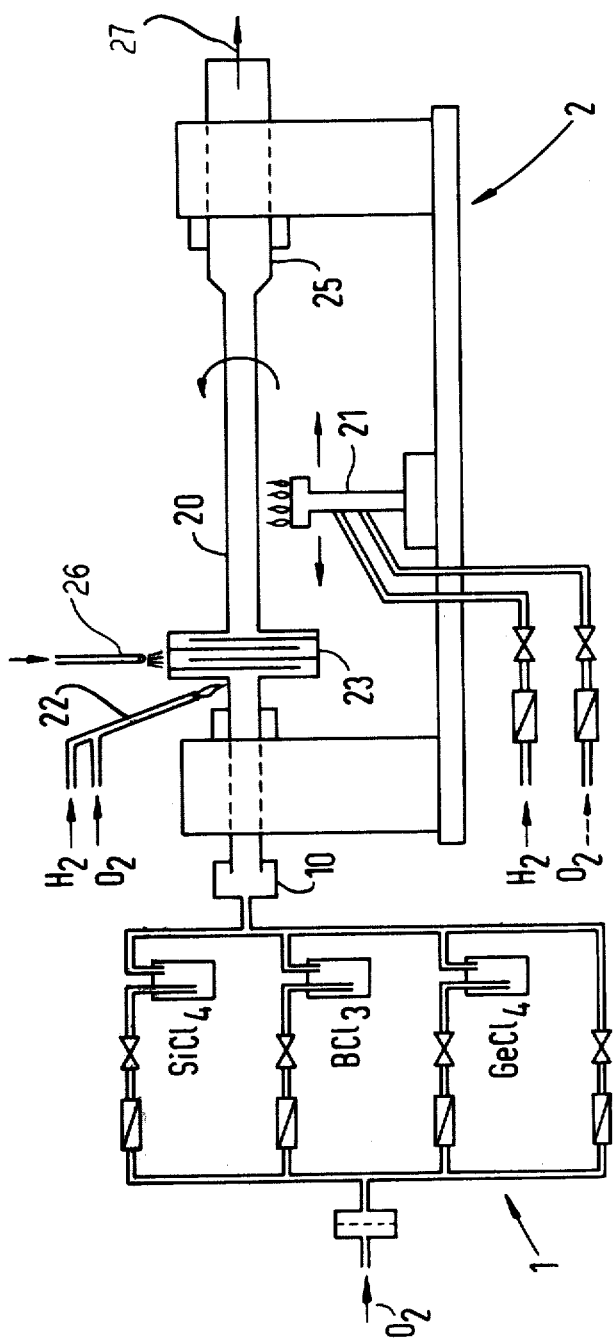
FIG. 1 is a schematic view illustrating an apparatus or a device for the implementation of the process according to the present invention.

The principles of the present invention are particularly useful when incorporated in a process utilizing a device generally illustrated in FIG. 1 for depositing glass films on an inner surface of a quartz glass tube 20. The device has a gas mixture system 1 and a glass turning lathe 2.

For a detailed explanation of the invention, it is based on the following example in which the quartz glass tube 20 has its interior supplied with a reaction gas and has glass films or layers formed on an inner wall or surface of the tube. It should be further assumed that the silicon dioxide and doped oxides, for example $P_2O_5$ or $B_2O_3$, are precipitated in a powder form from the reaction gas and these powders are then melted until they produce a clear glass layer.

In the described example, good absorption properties of the amorphous, doped, or extremely pure silicon dioxide powders, which are produced from the gas phase, are exploited and are used to cleanse the reaction gas flow which, in this case, includes the dopant gas flow. For this purpose, a powder precipitator 23 composed of glass is arranged to proceed the quartz glass tube 20 relative to the gas flow from the gas mixture system 1 and the precipitator has an outlet which is expediently fused to the end of the quartz glass tube 20. A heating zone proceeds the precipitator 23 and a chemical reaction will occur in this zone to produce amorphous $SiO_2$-$P_2O_5$ and $SiO_2$-$B_2O_3$ powders or other powders composed of the same gas mixture which are also used for the production of the synthetic glass for both the casing or cladding and the core of the glass fiber waveguide.

The powder produced in this way from the gas phase will partially adhere to the precipitator 23. At the end of the precipitation procedure, the precipitated powder serves as a surface active filter for the reaction gas when the portion of the gas which has not been decomposed in the precipitator, flows into the quartz glass tube, which is to be coated.

The temperature in the heating zone is only reduced as to the extent as to prevent any fundamental oxidation of the chlorides. However traces of H-containing compounds such as hydrocarbons and silanes react with oxygen in part or in whole to form polar, adhesive compounds. This will occur at a temperature of approximately 600° C.

Now, a second traveling heating zone is used to deposit a film or layer of powder on the quartz glass tube 20 and the film of powder is melted to form a clear glass film. This heating zone is created by a burner 21 and is moved along the tube so that the reaction tube 20 is coated uniformly over a considerable length. Normally, an adequate overall layer thickness is achieved by the use of a plurality of glass layers of the above described layer which can be achieved by repeated precipitation. During the return of the heating zone to a commencing or starting position, the powder precipitator 23 is reloaded with fresh surface active powder by the heating of the first heating zone created by the nozzle 22. The return time, which hitherto for was merely dead time, now is used for cleansing the starting material. By varying the return time, it is easy to accomodate or dispense a quantity of powder in the precipitator.

Thus, the powder precipitator serves alternately to precipitate the surface active oxide powder and the impurities. It is expediently constructed in the form of a labyrinth in which the powder or the impurities travel as a result of convection and diffusion towards the walls where they adhere as a result of surface energy. In order to improve the adhesion of the powder, the precipitator 23 can be cooled by means of an air flow from a nozzle 26. In contrast to the conventional techinques, pollution of the reaction tube by the cleansing means in the precipitator is comparatively uncritical as these cleansing powders, which precipitate from the gas phase, are fundamentally identical to the powder within the reaction tube 20.

The powder, which is not fused to form glass, is also precipitated at the end 25 of the heated length of tube 20. In this way, after a few precipitation cycles, the tube contains a double sided protection from impurities which is constantly renewed. When an adequate thickness of the cladding glass layer has been reached, the precipitation of the light conducting core glass is started. The all around protection of the core glass with respect to impurities, which may diffuse into the tube, will remain in existence at the end of the precipitation process even during the collapsing process.

Light conducting fibers, which were drawn in a conventional fiber drawing furnace from rods or workpieces produced in accordance with the invention, exhibit distinctly lower attentuation values within the spectral range of from 500–1400 nm in comparison to comparable fibers produced without the use of the powder precipitators.

The process in accordance with the invention can also be used for cleansing the reaction flow in the gas phase precipitation of oxide powders or glass or amorphous oxide layers on the outside of for example, cylindrical bodies or a flat disc. For example, the improvement can be used in the deposition on a rod, the Verneuille CVD process and the production of passivation layers on a semiconductor component.

The improvement can also be employed in processes, which use a different form of energy supply to the reaction gas. For example, the improvement can be used in processes, which precipitate from a gas flame such as the flame hydrolysis or processes that use plasma discharge such as a plasma CVD process.

Furthermore, the improved process can also be used for the production of extremely pure oxide powders from the gas phase as is required for example in crucible melting processes for the production of light conducting fibers. In any case, a preliminary precipitator is arranged to be ahead of the actual reaction zone.

The exemplary embodiment of the invention has now been described in detail with regard to the schematic illustration of the apparatus in FIG. 1. This apparatus or device fundamentally consists of the two parts namely a gas mixture system generally indicated by 1 and a glass turning lathe generally indicated at 2. A suitable gas mixture is produced in the gas mixture system 1. This takes place in a conventional manner using dispensing valves and heating vessels for liquid, oxidizable starting substance, as a rule chlorides, through which a flow of oxygen is passed by way of an oxidizing gas. For production of the casing or cladding glass, this apparatus can be used for example to produce a gas flow of a composition of 1100 Nml/min $O_2$, 90 Nml/min $SiCl_4$, 9 Nml/min $BCl_3$. For the production of the core glass 30 Nml/min $GeCl_4$ is added to this gas flow.

The glass production takes place in the second part of the apparatus or the glass turning lathe 2. The glass turning lathe has clamped therein a commercial quartz glass tube 20 of a 20 mm outer diameter and a 17 mm inner diameter, whose interior is to be coated. The lathe 2 will rotate the tube 20 about its longitudinal axis at an angular speed of 10 revolutions/sec. The central part of this tube 20 is heated by means of the burner 21, which moves from a starting point or position at a speed of 2.5 mm/sec. to the right for a distance of 50 cm and creates a narrow heating zone on the tube 20, which has a temperature of approximately 1600° C. After reaching the end of travel or right hand point, the burner 21 will be returned to the starting position at a speed of 17 mm/sec. and at the time of return to the starting point the tube will remain relatively cool.

As soon as the burner 21 has reached the starting position, the next heating cycle will commence. On the left-hand side of the heated length of the tube 20, the powder precipitator 23, which is composed of quartz glass, is fused onto the end of the tube. On the right-hand side there is arranged an adjoining quartz tube 25, which has a larger diameter for example 40 mm and which serves as an exhaust tube which leads to a suction system as indicated by arrow 27.

The reaction gas mixture is applied to the quartz glass tube from the left-hand side through a rotary duct 10 which is impervious to the gas. Each time the burner 21 is returning to a starting position, a second smaller burner 22 is switched on directly proceeding the precipitator 23 and locally heats the reaction gas mixture to a temperature at which the powder formation from the gas phase commences. In the present example, this temperature is approximately 1400° C.

The powder thus formed is then precipitated as a white coating in the precipitator 23. In order to increase its effectiveness, the precipitator is cooled externally by a shower of air from a nozzle 26.

When the heating of the tube by means of the burner 21 commences, the oxygen supply for the burner 22 is disconnected. Thus, the tube leading into the precipitator is heated only by a hydrogen air flame which produces a temperature that is still adequate to decompose a compound containing hydrogen, such as for example $SiHCl_3$, in the reaction gas flow. In the traveling heating zone, a conversion to oxide powder and then into glass takes place. At the end of the heated length of the tube, such as at the tube 25, the powder is accumulated which will not be completely melted into clear glass.

Following ten precipitation cycles using a $BCl_3/SiCl_4/O_2$ mixture, the production of the casing or cladding glass is furnished and $GeCl_4$ is added to the glass flow so that the requisite jump in the index of refraction between the cladding glass and the core glass is reached. Without interrupting the experiment, fifty further precipitation cycles are carried out. The tube is then collapsed to form a rod by a stepped reduction in the speed of the forward movement of the burner 21 and thus an associated increase in the temperature at the heating zone. Here the chloride supply is virtually disconnected and only a small concentration of $GeCl_4$ is maintained in the gas flow in order to compensate for vaporization losses of $GeO_2$ on the inner wall of the coated tube. Shortly prior to the collapse of the tube to form the rod or workpiece, the gas flow is completely cut off. The rod can be then drawn to form the fiber.

A comparison of the attenuation values of these fibers with the values of fibers produced by the same method or procedure but without the use of the powder precipitate indicates that the impurity content and thus the light absorption can be reduced by means of the powder precipitation.

As best illustrated in FIG. 2, the powder precipitator 23 has a body with an inlet and an outlet with a plurality of partitions or wall segments 29 which are illustrated as being interdigitally arranged. Thus, the gas entering through the inlet as indicated by arrow 31 passes through the labyrinth or tortuous path prior to discharge from the outlet as indicated by arrow 32.

Although various minor modifications may be suggested by those versed in the art, it should be understood that we wish to embody within the scope of the patent granted hereon, all such modifications as reasonably and properly come within the scope of our contribution to the art.

We claim:

1. In a process for the production of a workpiece from which a glass fiber light waveguide of a low attenuation is drawn, said process comprising providing a body, providing a reaction gas, producing an amorphous glass powder from the reaction gas by a chemical reaction, precipitating said amorphous glass powder on the body, and subsequently transforming the precipitated powder into a clear glass layer, the improvement comprising the step of providing the reaction gas including the steps of providing a filter composed of a powder of amorphous glass of an identical nature to the amorphous glass being precipitated on the body from the chemical reaction of the reaction gas, and contacting the reaction gas with the powder of the filter prior to the step of producing the amorphous glass powder by the chemical reaction.

2. In a process according to claim 1, wherein the step of providing the filter containing the powder of amorphous glass comprises providing a powder precipitator containing the amorphous glass powder of the filter, and supplying a reaction gas to the precipitator to produce that amorphous glass powder therein.

3. In a process according to claim 2, wherein the step of providing a body provides a hollow tubular body having an interior surface being contacted by the reaction gas, said hollow body being connected to an opening of the powder precipitator.

4. In a process according to claim 3, wherein the opening of the powder precipitator is fused to the end of the tubular body.

5. In a process according to claim 2, wherein the powder precipitator is constructed in the form of a labyrinth powder precipitator.

6. In a process according to claim 1, wherein the reaction gas contains at least one oxidizable silicon compound and an oxidizing gas.

7. In a process according to claim 6, wherein the reaction gas contains an oxidizable reducing compound.

* * * * *